United States Patent [19]

Sakaida et al.

[11] Patent Number: 4,755,771
[45] Date of Patent: Jul. 5, 1988

[54] EQUALIZING CIRCUIT

[75] Inventors: Yousuke Sakaida; Harutomo Narita, both of Tokyo, Japan

[73] Assignee: OKI Electric Industry Co., Ltd., Tokyo, Japan

[21] Appl. No.: 23,107

[22] Filed: Mar. 6, 1987

[30] Foreign Application Priority Data

Mar. 12, 1986 [JP] Japan ................................. 61-52352

[51] Int. Cl.$^4$ ............................................ H03G 3/20
[52] U.S. Cl. ..................................... 330/304; 330/86; 330/107; 330/282
[58] Field of Search .................. 330/86, 107, 282, 304; 333/28 R

[56] References Cited

FOREIGN PATENT DOCUMENTS 41332 3/1985 Japan .................................. 330/304

Primary Examiner—James B. Mullins
Attorney, Agent, or Firm—Wenderoth, Lind & Ponack

[57] ABSTRACT

An equalizer circuit for equalizing a signal attenuated in frequency while the same is transmitted through a transmission line and eliminates out-band high frequency noise so as to provide a signal having flat frequency characteristics. The equalizing circuit includes a high-pass circuit, a Sallen-Key low-pass circuit capable of gain regulation, constructed by connecting the output terminal of an operational amplifier through a resistance to the negative input terminal of the same and grounding the negative input terminal through a variable resistance, an amplifying circuit capable of gain control for amplifying a signal supplied to the positive input terminal of the operational amplifier of the Sallen-Key low-pass circuit, and a control circuit which detects the peak level of the output signal of the amplifying circuit and controls the resistance of the variable resistance of the Sallen-Key low-pass circuit and the gain of the amplifying circuit on the basis of the result of the detection.

10 Claims, 5 Drawing Sheets

EQUALIZING CIRCUIT

BACKGROUND OF THE INVENTION

1. Field of the Invention:

The present invention relates to an equalizing circuit for correcting the frequency characteristics and level of signals being transmitted through a transmission circuit.

2. Description of the Prior Art:

FIG. 2 is a circuit diagram showing the constitution of an exemplary conventional equalizing circuit. Shown in FIG. 2 are an integrated circuit LS12 in a package form, and the terminals T1 to T5 of the integrated circuit LS12. A high-pass circuit is constructed by connecting the positive terminal of an operational amplifier OP1 to the terminal T1 for receiving an input signal to be amplified, connecting the negative terminal of the operational amplifier OP1 through a resistance R1 to analog switches S1 to Sn for grounding the negative terminal selectively through capacitors C1 to Cn, respectively, and connecting the output terminal of the operational amplifier OP1 through a variable resistance R2 to the negative terminal. The output of the operational amplifier OP1 is provided as an amplified signal through a low-pass circuit LPF2, an operational amplifier OP2 for eliminating out-band high frequency noise, and an operational amplifier OP3 for compensating for a loss in the signal level attributable to the length of the transmission circuit. A peak detecting circuit PKDET2 detects the peak level of the output signal of the operational amplifier OP3, regulates the gain of the operational amplifier OP1 by controlling the variable resistance R2 on the basis of the result of its detection, actuates the analog switches S1 to Sn selectively and regulates a feedback variable resistance R3 for the operational amplifier OP3 to carry out the precise correction of the frequency and signal level, which will be described hereinafter.

FIGS. 3A and 3B are graphs showing the characteristics of a circuit connected to the terminal T1. FIG. 3A shows the variation of the frequency characteristics with the length of the circuit; the signal level drops in a high frequency range as the length of the circuit increases. FIG. 3B shows the variation of the frequency characteristics with circuit length for circuit losses; the level drops due to circuit loss in the entire frequency range.

To equalize the circuit, the equalizing circuit needs to have correction characteristics as shown in FIG. 4A to correct the frequency characteristics of FIG. 3A, and to have correction characteristics as shown in FIG. 4B to correct the frequency characteristics of FIG. 3B.

FIGS. 5A, 5B and 5C show the control characteristics of the equalizing circuit of FIG. 2. As shown in FIG. 5A, the cut-off frequency is variable through the selective control of the analog switches S1 to Sn. As shown in FIG. 5B, the low-pass circuit LPF2 cuts off the high frequency range. FIG. 5C shows the resultant correction characteristics.

The foregoing conventional equalizing circuit needs many parts in addition to the integrated circuit LS12, and hence the integral circuit LS12 needs to be provided with many terminals. Furthermore, inevitable manufacturing irregularity in the resistances of the analog switches S1 to Sn causes the characteristics of the high-pass circuit including the operational amplifier OP1 to vary.

SUMMARY OF THE INVENTION

Accordingly, an object of the present invention is to provide an equalizing circuit employing a compact integrated circuit package and capable of ensuring stable transmission characteristics.

In order to achieve the object of the invention, the present invention provides an equalizing circuit comprising: a high-pass circuit; a Sallen-Key low-pass circuit capable of gain regulation, constructed by connecting the output terminal of an operational amplifier through a resistance to the negative input terminal of the same and grounding the negative input terminal through a variable resistance; an amplifying circuit capable gain control for amplifying a signal applied to the positive input terminal of the operational amplifier of the Sallen-Key low-pass circuit; and a control circuit which detects the peak level of the output signal of the amplifying circuit and controls the resistance of the variable resistance of the Sallen-Key low-pass circuit or the gain of the amplifying circuit on the basis of the result of detection.

According to the present invention, the high-pass circuit amplifies the high-range frequencies of an input signal attenuated while the input signal is transmitted through a circuit by a predetermined width, the Sallen-Key low-pass circuit further amplifies the high-range frequencies to eliminate outband high frequency noise, and then the amplifying circuit amplifies the signal to provide a signal having flat frequency characteristics.

The above and other objects, features and advantages of the present invention will become more apparent from the following description when taken in conjunction with the accompanying drawings.

DESCRIPTION OF THE PREFERRED EMBODIMENT

Figure 1:
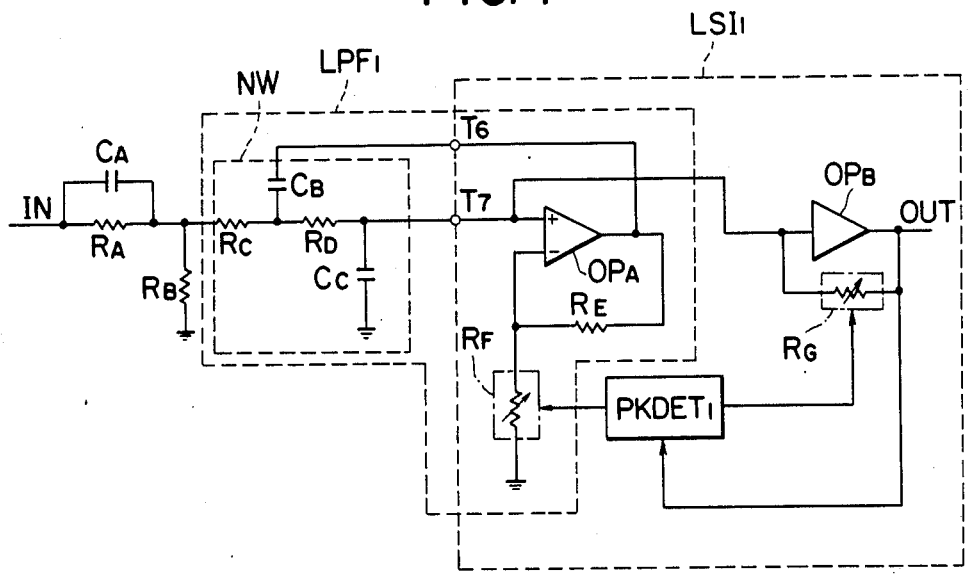
FIG. 1 is a circuit diagram of an equalizing circuit, in a preferred embodiment, according to the present invention.
Figure 2:
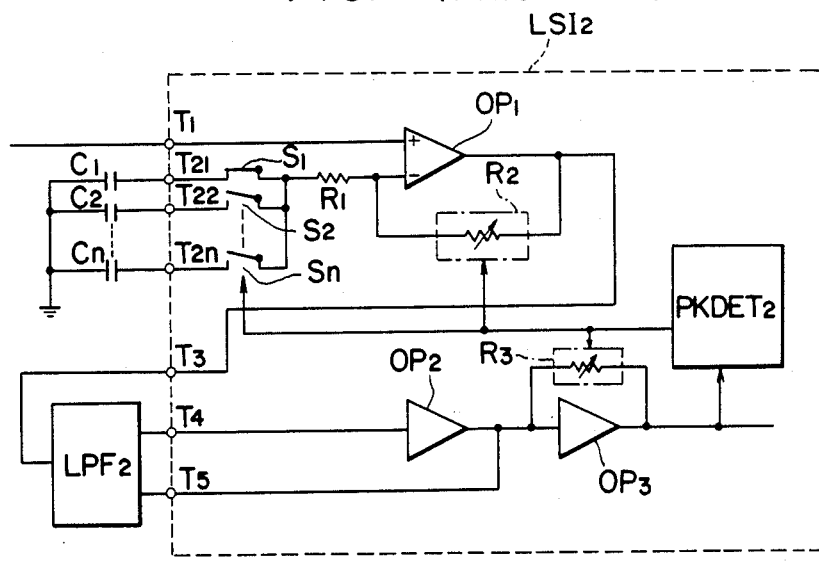
FIG. 2 is a circuit diagram of a conventional equalizing circuit.

Shown in FIG. 1 are an integrated circuit LSI1 formed in a package, the terminals T6 and T7 of the integrated circuit LSI1, a high-pass circuit which receives an input signal IN corrects the frequency characteristics of the transmission circuit and is comprised of a capacitor CA and resistances RA and RB, and a Sallen-Key low-pass circuit LPF1. The input signal IN transmitted through the high-pass circuit is supplied to the positive terminal of a first operational amplifier OPA through a three-terminal network NW which is comprised of resistances RC and RD of the same resistance and capacitors CB and CC of the same capacitance, and the terminal T7. The output signal of the first operational amplifier OPA is supplied through the terminal T6 and the capacitor CB of the three-terminal network NW to the positive terminal thereof for positive feedback. The output signal of the first operational amplifier OPA is fed back also to the negative terminal thereof via resistance RE, and a variable resistance RF is connected to the negative terminal of the first operational amplifier OPA, so that the gain of the first operational amplifier OPA is variable.

The input terminal of a second operational amplifier OPB is connected to the positive terminal of the first operational amplifier OPA. The output signal of the second operational amplifier OPB, namely, the desired amplified signal to be provided by the integrated circuit LSI1, is fed back through a variable resistance RG to the input terminal thereof.

A signal peak detecting circuit PKDET1 detects the peak level of the second operational amplifier OPB, and regulates the variable resistance RF on the basis of detection to regulate the gain of the first operational amplifier OPA and the feedback variable resistance RG of the second operational amplifier OPB so that the frequencies and level of the signal are corrected properly.

Figure 6A:
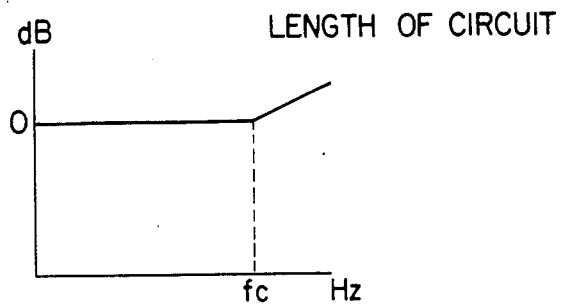
FIGS. 6A, 6B and 6C are graphs showing the correction characteristics of the equalizing circuit of the present invention.

In operation, the input signal IN, namely, a signal to be amplified, is filtered by the high-pass circuit consisting of the resistance RA and the capacitor CA, so that the frequency characteristics of the input signal IN assumes a gradually increasing curve as shown In FIG. 6A in the frequency range beyond a cut-off frequency fc.

In the low-pass circuit LPF1, since RC=RD and CB=CC, the gain K of the first operational amplifier OPA and the Q of the low-pass circuit LPF1 are expressed by:

$$Q = 1/(3-k)$$

$$K = 1 + RE/RF$$

Figure 3A:
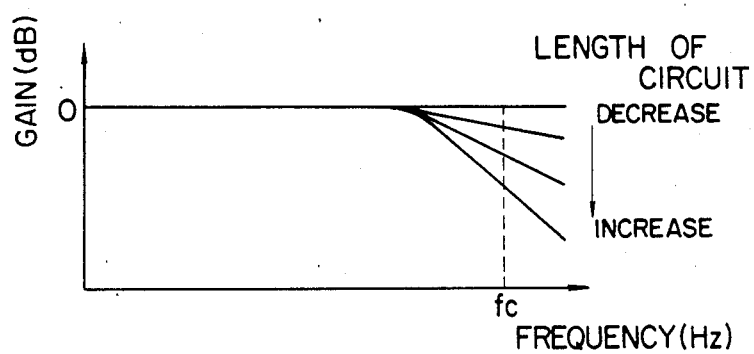
FIGS. 3A and 3B are graphs showing the frequency characteristics of a circuit.
Figure 3B:
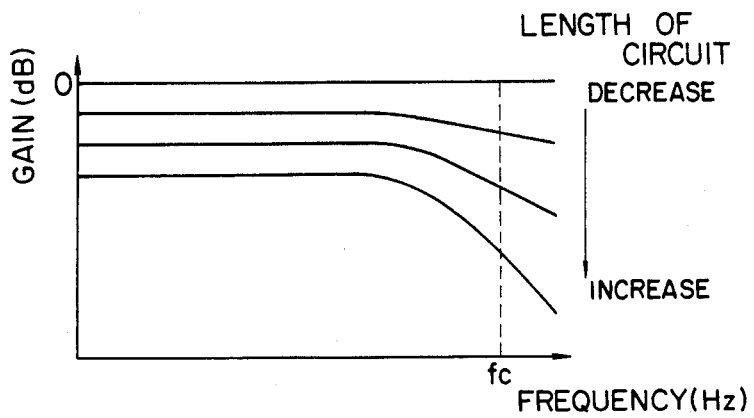
Figure 4A:
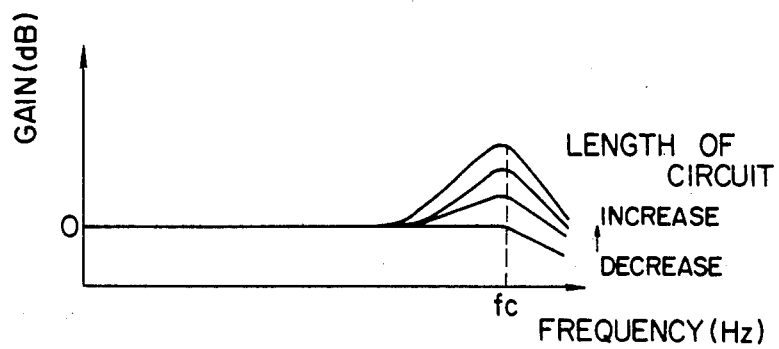
FIGS. 4A and 4B are graphs showing the desired correction characteristics.
Figure 4B:
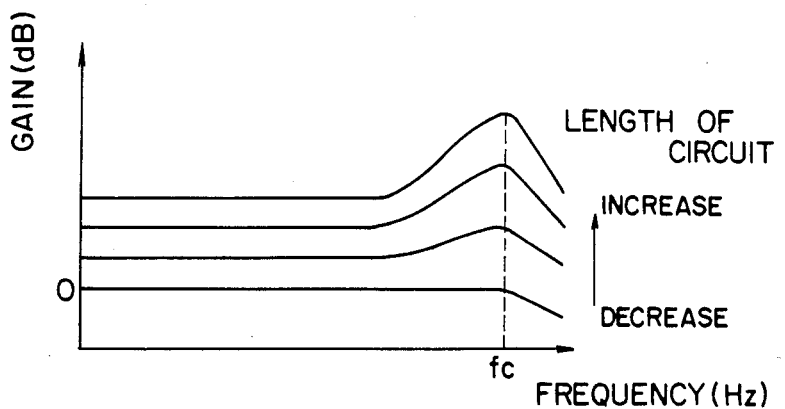
Figure 5A:
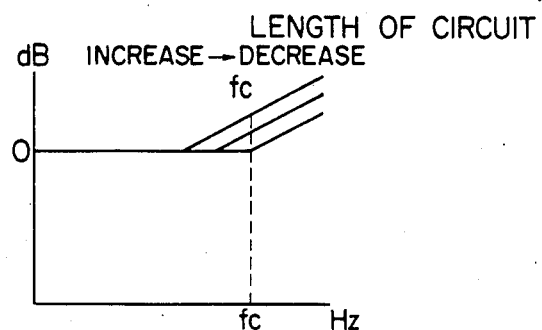
FIGS. 5A, 5B and 5C are graphs showing the correction characteristics of the conventional equalizing circuit.
Figure 5B:
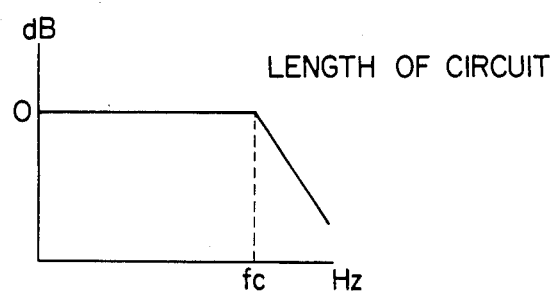
Figure 5C:
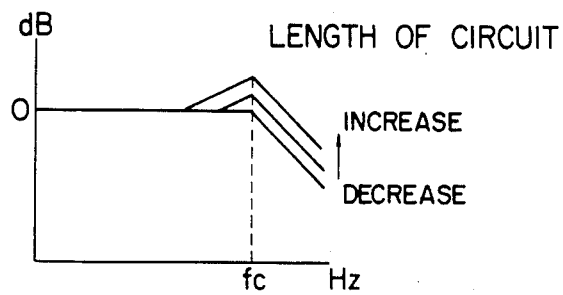
Figure 6B:
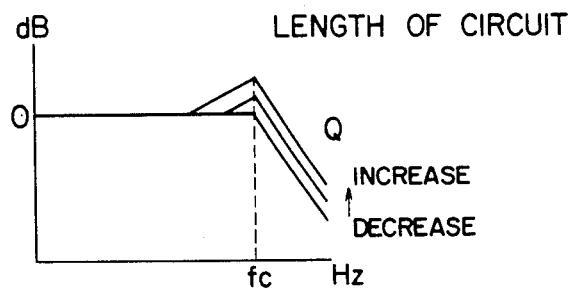
Figure 6C:
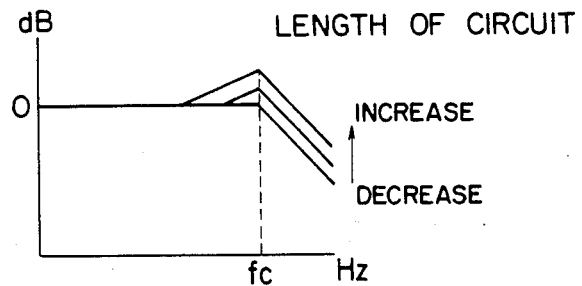

Thus, the Q is varied by means of the variable resistance RF. Since the input signal supplied to the positive terminal of the first operational amplifier OPA is supplied also to the input terminal of the second operational amplifier OPB, the frequency characteristics are dependent on the variation of the Q irrespective of the gain K. As shown in FIG. 6B, when the Q increases, the frequency characteristics having a peak value coinciding the cut-off frequency fc are further corrected. Such combined frequency correction characteristics are shown in FIG. 6C. The peak detecting circuit PKDET1 detects the peak level of the output signal of the second operational amplifier OPB, and regulates the respective variable resistances RF and RG of the first operational amplifier OPA and the second operational amplifier OPB on the basis of the peak level of the output signal of the second operational amplifier OPB to correct the frequency characteristics varying with the length of the circuit and the circuit loss varying with the length of the circuit, so that equalizing characteristics as shown in FIGS. 3A and 3B are obtained.

As apparent from the foregoing description, according to the present invention, the frequency characteristics are compensated for merely by controlling the variable resistance of the low-pass circuit and not employing any switching element, and the performance of the variable resistance ratio including the temperature characteristics can be satisfactorily accurately controlled, which improves the compensating accuracy of the low-pass circuit. Furthermore, the external parts to be connected to the input side of the integrated circuit are connected to the input terminal and the feedback terminal of the integrated circuit, the integrated circuit needs to have only a few terminals, which facilitates constructing the integrated circuit in a compact package.

Although the invention has been described in its preferred form with a certain degree of particularity, it is to be understood that many changes and variations are possible therein without departing from the scope thereof.

What is claimed is:

1. An equalizing circuit for correcting frequency characteristics of input signals, said input signals being transmitted through a transmission circuit, said equalizing circuit comprising:
    a high-pass circuit connected to said transmission circuit for correcting said frequency characteristics of said input signals;
    a Sallen-Key low-pass circuit connected to said high-pass circuit, said Sallen-Key low-pass circuit having a first amplifying means, including a means for gain regulation thereof, for amplifying a signal from said high-pass circuit;
    a second amplifying means connected to an input terminal of said first amplifying means for amplifying a signal supplied to an input terminal thereof, said amplifying means including a means for gain regulation thereof;
    a control circuit connected to an output terminal of said second amplifying means for detecting the peak level of an output signal of said second amplifying means and for providing an output corresponding thereto, said control circuit output connected to both of said means for gain regulation, thereby controlling the gain of said first and second amplifying means on the basis of the detected peak level.

2. An equalizing circuit as recited in claim 1, wherein said first amplifying means has a high impedance input impedance and a low output impedance.

3. An equalizing circuit as recited in claim 1, wherein said second amplifying means has a high input impedance and a low output impedance.

4. An equalizing circuit as recited in claim 1, wherein said first amplifying means has an operational amplifier, a resistance and a variable resistance, an output terminal of said operational amplifier being connected to a negative input terminal thereof through said resistance, said negative input terminal being grounded through said variable resistance, whereby said Sallen-Key low-pass circuit effects a gain regulation thereof.

5. An equalizing circuit as recited in claim 4, wherein said Sallen-Key low-pass circuit has a first resistance, a second resistance, a first capacitor and a second capacitor, one terminal of said first resistance being connected to said high-pass circuit, another terminal of said first resistance being connected to a positive input terminal of said operational amplifier through said second resistance and, further, being connected to an output terminal of said operational amplifier through said first capacitor, said positive input terminal of said operational amplifier being grounded through said second capacitor.

6. An equalizing circuit as recited in claim 1, wherein said second amplifying means has a variable resistance, an output terminal of said second amplifying means being connected to an input terminal thereof through said second variable resistance, whereby said second amplifying means effects a gain regulation thereof.

7. An equalizing circuit as recited in claim 1, wherein said control circuit is a peak detecting circuit.

8. An equalizing circuit for correcting frequency characteristics of input signals, said input signals being transmitted through a transmission circuit, said equalizing circuit comprising:
- a high-pass circuit connected to said transmission circuit for correcting said frequency characteristics of said input signals;
- a Sallen-Key low-pass circuit connected to said high-pass circuit, said Sallen-Key low-pass circuit having an operational amplifier, a resistance and a first variable resistance, the output terminal of said operational amplifier being connected to a negative input terminal thereof through said resistance, said negative input terminal being grounded through said first variable resistance, whereby said Sallen-Key low-pass circuit effects a gain regulation thereof;
- an amplifying circuit connected to a positive input terminal of said operational amplifier for amplifying a signal supplied to said positive input terminal of said operational amplifier, said amplifying circuit having a second variable resistance, an output terminal of said amplifying circuit being connected to an input terminal thereof through said second variable resistance, whereby said amplifying circuit effects a gain regulation thereof;
- a control circuit connected to an output terminal of said amplifying circuit for detecting the peak level of an output signal of said amplifying circuit and for providing an output signal corresponding thereto, said output signal of said control circuit controlling the value of said first variable resistance and the value of said second variable resistance on the basis of the detected peak level.

9. An equalizing circuit as recited in claim 8, wherein said Sallen-Key low-pass circuit has a first resistance, a second resistance, a first capacitor and a second capacitor, one terminal of said first resistance being connected to said high-pass circuit, another terminal of said first resistance being connected to said positive input terminal of said operational amplifier through said second resistance and, further, being connected to an output terminal of said operational amplifier through said first capacitor, said positive input terminal of said operational amplifier being grounded through said second capacitor.

10. An equalizing circuit as recited in claim 8, wherein said control circuit is a peak detecting circuit.

* * * * *